United States Patent [19]

Duncan et al.

[11] 4,058,429

[45] Nov. 15, 1977

[54] INFRARED TEMPERATURE CONTROL OF CZOCHRALSKI CRYSTAL GROWTH

[75] Inventors: Charles Duncan, Penn Hills Township, Alleghany County; Richard H. Hopkins, Monroeville, both of Pa.

[73] Assignee: Westinghouse Electric Corporation, Pittsburgh, Pa.

[21] Appl. No.: 637,550

[22] Filed: Dec. 4, 1975

[51] Int. Cl.² .............................................. B01J 17/18
[52] U.S. Cl. ................................ 156/601; 23/273 SP; 156/617 SP; 356/72
[58] Field of Search .................... 23/273 SP; 156/601, 156/617 SP; 356/72, 43

[56] References Cited

U.S. PATENT DOCUMENTS

| 2,979,386 | 4/1961 | Shockley et al. | 156/601 X |
| 3,284,172 | 11/1966 | Binder | 156/601 |
| 3,493,770 | 2/1970 | Dessauer et al. | 23/273 SP X |
| 3,621,213 | 11/1971 | Jen | 23/273 SP |

FOREIGN PATENT DOCUMENTS

| 602,876 | 8/1960 | Canada | 156/601 |

OTHER PUBLICATIONS

Sutcliffe, et al., "Temperature Control System for a Silicon Pulling Furnace," Review of Scientific Instruments, vol. 27, No. 8, p. 656, (1956).

*Primary Examiner*—Norman Yudkoff
*Assistant Examiner*—Barry I. Hollander
*Attorney, Agent, or Firm*—C. F. Renz

[57] ABSTRACT

A method and apparatus for controlling the diameter of single crystals grown by the Czochralski process in which an infrared sensor determines the temperatures of the melt adjacent to the crystal and a control circuit compares an average of these temperatures to a reference temperature to provide an error signal which controls the inductive heating of the melt.

16 Claims, 1 Drawing Figure

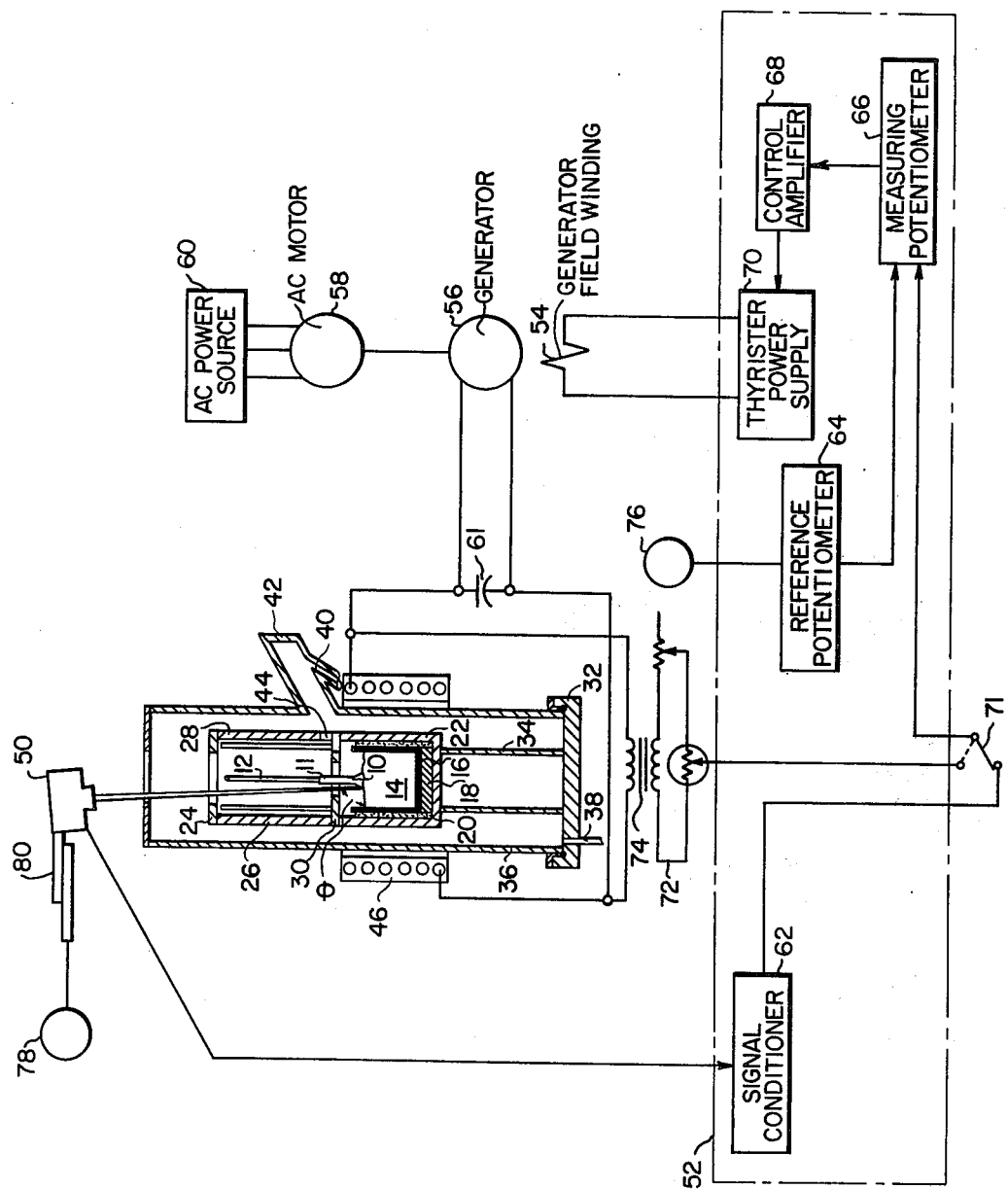

INFRARED TEMPERATURE CONTROL OF CZOCHRALSKI CRYSTAL GROWTH

BACKGROUND OF THE INVENTION

1. Field of the Invention

The invention relates to a method and apparatus for controlling the diameter of crystals grown by the Czochralski process.

2. Description of the Prior Art

The Czochralski process has, for many years, been used to grow single crystals from a melt of the crystal material. The melt is contained in a crucible into which an appropriately oriented seed is dipped. After the seed has reached thermal equilibrium, it is slowly withdrawn causing the formation of new crystalline structure at the interface of the crystal and the melt. The rate of crystal growth depends on the balance between the heat lost from the crystal by radiation and convection and the heat input from the melt to the crystal. Under steady state conditions, the rate of crystal growth equals the rate of withdrawal from the melt. An increase in heat input or withdrawal rate of the crystal diminishes the diameter, while a decrease in heat input or the withdrawal rate of the crystal increases the diameter.

Prior art methods having attempted to control the diameter of crystals grown by the Czochralski method by controlling either the temperature of the melt or the rate at which the crystal is withdrawn from the melt. Temperature of the melt and the withdrawal rate of the crystal have been controlled in relation to a human operator's observation of deviations in the diameter of the crystal and in relation to thermostatic measuring devices.

Although the control of the crystal diameter by human operators is adequate for some types of crystals, the physical properties of other types of crystals demand an automated diameter control method. Where the method of controlling the crystal diameter had been to regulate the withdrawal rate of the crystal, the thermostatic measuring devices have included infrared sensors. However, since the prior art methods of controlling the withdrawal rate of the crystal require precise mechanical control, these methods have been expensive and have not provided the degree of accuracy required for the growth of certain types of crystals for example, oxide-type optical materials. Methods which regulate the diameter of the crystal by controlling the temperature of the melt have not used infrared sensors and have not been sufficiently responsive for accurate control of the crystal diameter. Therefore, there was a need for a more accurate method of controlling the diameter of crystals grown by the Czochralski process.

SUMMARY OF THE INVENTION

The diameter of crystals grown by the Czochralski process is controlled through infrared sensing of the melt surface temperature at a point adjacent to the crystal and controlling the temperature of the melt in relation to a damped average of the sensed temperature. The damped averaging of the sensed temperature, which is accomplished by a signal conditioner which receives the infrared sensed temperature, provides a time constant which accounts for temperature variations in the melt due to convective flow. The average temperature signal is transferred to a measuring potentiometer which provides, in relation to a predetermined reference temperature, an error signal to an amplifier which controls a thyristor power supply. The thyristor power supply regulates the field strength of a generator providing current to a work coil which inductively heats the crucible containing the melt. During warm-up and cooling-off periods, the measuring potentiometer may be selectively switched from the infrared sensor signal conditioner to a thermal converter which is inductively coupled to the generator output to provide automatic warm-up and slow cooling-off modes of operation.

Since the crystal diameter is controlled in relation to the infrared sensed temperature of the melt surface at a point adjacent to the crystal, the diameter of the crystal may be varied in a controlled manner by varying the location of the infrared scanning point on the melt surface.

BRIEF DESCRIPTION OF THE DRAWINGS

The drawing shows a schematic illustration of the present method and apparatus for controlling the diameter of crystals grown by the Czochralski process.

DESCRIPTION OF THE PREFERRED EMBODIMENT

The preferred embodiment of the present invention discloses a method and apparatus for growing calcium lanthanum silicate oxyapatite crystals by the Czochralski process. Calcium lanthanum silicate oxyapatite (CaLaSOAP:Nd) is a high energy storage laser material developed for use in laser rangers, designators, and illuminators. The energy output of calcium lanthanum silicate oxyapatite is subject to laser damage due to second phase inclusions of iridium or other non-metallic particles within the crystal during its growth. The inclusion of these particles is a consequence of variations in the diameter of the growing crystal. Therefore, calcium lanthanum silicate oxyapatite is of the class of materials which require precise diameter control if they are to be grown by the Czochralski process.

The disclosed method and apparatus for controlling the diameter of Czochralski grown crystals is described in relation to the drawing. According to the well-known Czochralski method, a CaLaSOAP:Nd crystal seed 10 is fixed to an iridium sleeve 11 which is connected to an alumina pullrod 12 and lowered into a CaLaSOAP:Nd melt 14. Melt 14 is contained in an iridium crucible 16 which is supported on the bottom by a zirconia brick base 18 and on the sides by powdered zirconia 20. The crucible 16, zirconia brick base 18 and powdered zirconia 20 are contained in a zirconia crucible holder 22. Zirconia crucible holder 22 includes an upper chamber comprised of a top plate 24, side walls 26 and 28 and reflector 30. Top plate 24 and reflector 30 are provided with holes through which the CaLaSOAP:Nd seed 10 and alumina pullrod 12 are lowered. The zirconia crucible holder 22 is supported from a base plate 32 by an alumina pedestal 34. Zirconia crucible holder 22 and alumina pedestal 34 are enclosed in quartz envelope 36 containing an argon atmosphere which is provided through argon inlets 38 and 40. A sight port 42 is provided in quartz envelope 36 and a view slot 44 is provided in side wall 28 for viewing a crystal growing in melt 14. The temperature of melt 14 is maintained at approximately 2,170° C by inductive heating of iridium crucible 16 with work coil 46.

Where equilibrium is established between the heat lost from the crystal and the heat imparted to the crystal from the melt 14, the rate of crystal growth equals the rate of withdrawal from the melt. Therefore, when the withdrawal rate is constant, the temperature of the ring of melt immediately surrounding the growing crystal is the critical variable for determining crystal growth. If this temperature can be maintained substantially constant, a constant withdrawal rate will produce a constant diameter crystal.

The disclosed method controls the diameter of the growing crystal by maintaining a substantially constant effective surface temperature of the ring of melt immediately adjacent to the crystal in relation to a damped average of temperature sensed at a point immediately adjacent to the crystal. Because the ring of melt immediately adjacent to the crystal is of substantially constant average temperature, it is sufficient to measure the temperature of only one point on the ring. A damped average of the temperature of the melt surface point is used because convective flow of the melt in the crucible causes considerable agitation which is accompanied by large aperiodic temperature oscillations. For example, during the growth of CaLaSOAP:Nd, fluctuations as large as 30° Centigrade about the average melt temperature occur at a rate of roughly one per second. Although the magnitude of the temperature oscillations decreases in the more quiescent melt adjacent to the CaLaSOAP:Nd crystal, these temperature oscillations remain large and in the order of 5° to 10° Centigrade. Because these rapid temperature oscillations are highly localized and because the response time of a temperature controlled system is relatively slow, it is desirable to control the temperature of the melt in relation to a suitably damped average value of temperature of the melt surface temperature point.

In the apparatus of the preferred embodiment the temperature sensed by an infrared sensor 50 is used in relation to a reference temperature to establish the temperature of the melt. Infrared sensor 50, which acts as an optical pyrometer, is comprised of an optical lens system for gathering and focusing incident radiation of a point on the surface of the melt immediately adjacent to the growing crystal onto a silicon photovoltaic detector which is sensitive in the 0.70 to 0.97 micrometer region. Infrared sensor 50 produces a signal which is proportional to the instantaneous radiant energy emitted from the surface point adjacent to the growing crystal. This signal is transferred to a field control 52 which provides a controlled current to the generator field winding 54 of generator 56. Generator 56 is driven by a prime mover which, for example, may be comprised of a motor 58 driven from an AC power source 60. The output current of generator 56, as determined by the strength of generator field 54, provides an electrical current across tuning capacitor 61 to work coil 46 which establishes the temperature of melt 14 by the inductive heating of iridium crucible 16.

Field control 52 includes a signal conditioner 62, a reference potentiometer 64, a measuring potentiometer 66, a control amplifier 68, and a thyristor power supply 70. Signal conditioner 62 modifies the response rate of infrared sensor 50 to provide a voltage proportional to the average value of the melt temperature at the sensing point on the melt surface. Reference potentiometer 64 provides an output which represents the output signal conditioner 62 would have for a predetermined reference temperature. When selector switch 71 is in the first position, shown by the solid lines, the output of signal conditioner 62 is transferred through selector switch 71 to measuring potentiometer 66 so that potentiometer 66 provides an error signal which is proportional to the difference between a reference signal from reference potentiometer 64, and the output of signal conditioner 62 which represents the actual average temperature detected by infrared sensor 50. The error signal of measuring potentiometer 66 is transferred to control amplifier 68 which has response features to allow it to be tuned to the thermal and electrical characteristics of the crystal growth system as is well known to persons skilled in this art. Control amplifier 68 regulates the output of thyristor power supply 70.

Signal conditioner 62 provides an average output signal by appropriately damping the instantaneous temperature signal received from infrared sensor 50. Proper selection of a response rate of signal conditioner 62 to the infrared sensor 50 is important in obtaining satisfactory control system performance. The response should be chosen at the fastest rate which will provide a sufficiently smooth average output for use with the temperature control system. The response rate selected should be the fastest permissible value in order to limit the time constant of the temperature control loop and improve the response of the system. For the growth of CaLaSOAP:Nd, a response time of ten seconds has been found to be suitable.

During warm-up and cool-off periods, when the precise temperature of melt 14 is not critical, selector switch 71 may be moved to its second position as shown by the dashed lines to disconnect measuring potentiometer 66 from signal conditioner 62 and connect it to a thermal converter 72. Thermal converter 72, which is inductively coupled to the output current of generator 56 by transformer 74, approximates the temperature of melt 14 in relation to the output current of generator 56 to provide measuring potentiometer 66 with an error signal of adequate precision for the warm-up and cooling-off stages. During the cooling-off stage, a multi-range gear motor 76 controls the reference potentiometer 64 to gradually lower the reference voltage representing the reference melt temperature, and the lowering of the reference voltage limits the error signal of measuring potentiometer 66 such that gradual cooling of the melt 14 results. In the manufacture of CaLaSOAP:Nd, the gradual change of reference potentiometer 64 by multi-range gear-motor 76 is necessary because the physical properties of CaLaSOAP:Nd are such that the crystals will fracture if cooled too rapidly.

Since the diameter of the growing crystal is established by controlling the temperature of the melt 14 in relation to a particular melt surface point located adjacent to the crystal, and since the melt surface has a decreasing temperature gradient from the crucible 16 to the growing crystal, the diameter of the crystal may be varied by changing the location of the melt surface point at which the melt temperature is sensed. For example, during the crystal growing process, if the crystal diameter is to be increased to a predetermined value, the location of the melt surface point would be moved away from the growing crystal to a second location which would be adjacent to the crystal if it were of the larger diameter. Because of the melt temperature gradient, the temperature of the melt surface at this point is greater than at the former melt surface point causing the temperature control to decrease the melt temperature thereby increasing the rate of crystal growth. Since the rate of crystal withdrawal remains constant, the crystal diameter increases until the crystal is adjacent to the second melt surface point. Thereafter, the melt surface point is maintained at a temperature substantially equal to the reference temperature and the crystal diameter again becomes constant. In an analogous manner, the diameter of the crystal can be decreased by moving the location of the melt surface temperature point closer to the growing crystal where the average temperature is lower than the reference temperature. This causes the melt temperature control mechanism to increase the melt temperature and, for a constant rate of crystal withdrawal, decrease the diameter of the crystal. When the crystal diameter has decreased so that the melt surface point again is adjacent to the crystal, the temperature control mechanism maintains the melt temperature substantially at the reference temperature and growth of the crystal continues at a substantially constant diameter. Since the temperature gradient of the crystal is different from that of the melt, the crystal diameter cannot be reduced by directing infrared sensor 50 at a point directly on the growing crystal. Therefore, the rate of reduction in the crystal diameter is limited to the contangent of $\theta$, the angle of incidence between the line-of-sight of infrared sensor 50 and the horizontal surface of melt 14. This method for varying the diameter of the growing crystal is particularly useful during the initial step of the growing process for gradually expanding the diameter of the growing crystal from the diameter of the seed to a predetermined diameter.

The diameter of the crystal may be changed by causing multi-range gearmotor 78 acting through variable position mount 80 to vary the position of infrared sensor 50. Thus, by varying the position of sensor 50 the crystal diameter may be started at the seed diameter, gradually increased until a predetermined diameter is reached, and then held constant.

The location of the melt-surface temperature point and therefore, the diameter of the growing crystal, is dependent on the position of the infrared sensor 50 relative to the surface of melt 14, and the angle of incidence $\theta$ between the line-of-sight of infrared sensor 50 and the horizontal surface of melt 14. As the crystal is grown from melt 14, the quantity of the melt is being depleted or reduced and the distance between the level of the melt surface and infrared sensor 50 increases. The increase in distance between the melt surface and infrared sensor 50 will cause a steady decrease in the crystal diameter, the magnitude of which is dependent on the contangent function of the angle $\theta$. The effect of the falling melt surface level on the diameter of the crystal can, therefore, be limited by maintaining the angle of incidence $\theta$ at slightly less than 90°. Angles of approximately 87° have been used in actual practice for the growth of CaLaSOAP:Nd.

Where even slight decreases in the diameter of the crystal cannot be tolerated, or where sufficiently large angles of $\theta$ cannot be provided, the infrared sensor 50 and gearmotor 78 may be coupled to pullrod 12 so that the line-of-sight of infrared sensor 50 moves laterally outward from the center of the crystal as pullrod 12 is drawn vertically upward. A constant diameter crystal is obtained if the rate of lateral movement of the line-of-sight is in proportion to the contangent of $\theta$ times the rate of vertical movement of pullrod 12. Alternatively, a substantially constant diameter crystal could be obtained by moving infrared sensor 50 vertically in relation to the vertical movement of pullrod 12, or by rotating infrared sensor 50 so that its line-of-sight moves radially outward from the center of the crystal in relation to the vertical movement of pullrod 12. Also, the reference signal of reference potentiometer 64 could be varied in relation to the vertical movement of pullrod 12 to maintain a constant diameter crystal by gradually lowering the effective temperature of melt 14.

We claim:

1. A method for controlling the diameter of a crystal grown by withdrawing a seed from a melt, said method comprising:
    withdrawing the growing crystal from the melt at a constant rate;
    sensing the infrared spectrum of a point on the surface of the melt adjacent to said crystal to determine the instantaneous temperatures of said melt at said point; and
    controlling the temperature at the point on the surface of said melt in response to an average of the instanteneous temperatures at the point on the melt determined over a predetermined period of time.

2. The method of claim 1 in which said infrared spectrum of the point on the surface of said melt is sensed at a predetermined angle in relation to the plane on the surface of said melt to limit the variation in the diameter of said crystal as the level of the surface of said melt falls.

3. The method of claim 1 further comprising:
    controlling the location of the point on the melt surface at which the infrared spectrum is sensed to control the diameter of said crystal.

4. Apparatus for growing a crystal of controlled diameter by withdrawing a seed at a constant rate from a melt, said apparatus comprising:
    temperature sensing means for providing an output signal in response to the instantaneous melt temperature at a point on the surface of said melt adjacent to the crystal;
    means for heating the melt;
    means for energizing said heating means; and
    temperature control means responsive to the output signal of said temperature sensing means, said temperature control means determining an average of the output signal of said temperature sensing means and controlling said energizing means with respect to the average of the output signal to control the average temperature of the point on the melt adjacent to the crystal.

5. The apparatus of claim 4 in which said temperature control means includes:
    a signal conditioner providing an average of the temperature sensing means output signal in response to the temperature sensing means output signal;
    a reference potentiometer providing a predetermined reference temperature signal;
    a measuring potentiometer providing an error signal in response to the average of the temperature sensing means output signal provided by said signal conditioner, and in response to said reference temperature signal of said reference potentiometer;
    a control amplifier providing an output signal in controlled response to said error signal of said measuring potentiometer; and
    a thyristor power supply for energizing said heating means in response to the output signal of said control amplifier.

6. The apparatus of claim 4 further comprising:
    a thermal converter for approximating the temperature of said melt in response to the electric current provided by said energizing means; and switching means for selectively connecting said thermal converter to said measuring potentiometer during times for automatic warm-up and slow cooling-off of the melt, and for connecting said signal conditioner to said measuring potentiometer during times for growing crystals.

7. The apparatus of claim 5 further comprising:
a thermal converter which is operatively coupled to the output current of said power supply means to approximate the temperature of said melt; and
switching means for selectively connecting said thermal converter to said measuring potentiometer during times for automatic warm-up and slow cooling-off of the melt, and for connecting said signal conditioner to said measuring potentiometer during times for growing crystals.

8. Apparatus for controlling the diameter of a crystal grown by a constant rate of withdrawal from a melt contained in a crucible, said apparatus comprising:
an infrared sensor for determining the instantaneous temperature of a predetermined point on the surface of said melt;
temperature control means responsive to the output of said infrared sensor, said temperature control means averaging the output of said infrared sensor to establish a temperature control signal;
means for inductively heating said crucible; and
means for supplying power to said inductive heating means in response to said temperature control signal.

9. The apparatus of claim 8 in which said temperature control means includes:
a signal conditioner responsive to the output of said infrared sensor, said signal conditioner producing an output signal in accordance with an average of the instantaneous output of said infrared sensor;
a reference potentiometer providing a reference signal in response to a predetermined reference temperature;
a measuring potentiometer for determining said temperature control signal in response to said output signal of said signal conditioner and in response to said reference signal of said reference potentiometer;
means for amplifying said temperature control signal determined by said measuring potentiometer; and
thyristor means responsive to the output of said amplyfying means, said thyristor means being operative with said means for supplying power to control the power provided to said inductive heating means in response to said amplified control signal.

10. The apparatus of claim 8 further comprising positioning means for varying the diameter of said crystal by controlling the location of the point at which the melt temperature is measured by said infrared sensor.

11. The apparatus of claim 10 in which said positioning means include a multi-range gear motor.

12. Crystal growing apparatus for growing crystals of substantially constant diameter by withdrawing a crystal seed at a constant rate from a melt material, said apparatus comprising:
an infrared sensor for determining the instantaneous melt temperature at a point on the ring of melt surrounding the crystal;
means for averaging the instantaneous melt temperature determined by said infrared sensor;
a power supply that provides a power output in response to the average temperature of said averaging means; and
means for heating the melt in response to the power output of said power supply.

13. Crystal growing apparatus for growing a crystal of substantially constant diameter from a melt by controlling the temperature of the melt at the interface of the melt and the growing crystal and by controlling the rate of withdrawal of the crystal from the melt, said apparatus comprising:
an infrared sensor for determining the instantaneous melt temperature at a point on the ring of melt at the interface of the melt and the growing crystal;
means for averaging the instantaneous melt temperature determined by said infrared sensor;
a power supply that provides a power output which is proportional to the average temperature of said averaging means;
means for heating the melt in response to the power output of said power supply.

14. Crystal growing apparatus for growing a crystal of substantially constant diameter from a melt of material by maintaining a substantially constant melt temperature at the interface of the melt and the growing crystal and by maintaining a substantially constant rate of withdrawal of this crystal from the melt, said apparatus comprising:
and infrared sensor for determining the instantaneous melt temperature at a point on the ring of melt at the interface of the melt surface and the growing crystal;
means for averaging the instantaneous temperature at the point on the melt surface determined by said infrared sensor;
a power supply that provides a power output which is proportional to the average temperature determined by said averaging means; and
means for heating the melt in response to the power output of said power supply to maintain a substantially constant melt temperature at the interface of the melt and the growing crystal.

15. The apparatus of claim 14 in which said power supply includes a generator having a field winding that is responsive to the output of said averaging means.

16. The apparatus of claim 14 in which said heating means includes a work coil for inductively heating said melt.

* * * * *